United States Patent
Brucker et al.

(10) Patent No.: US 10,948,456 B1
(45) Date of Patent: Mar. 16, 2021

(54) GAS ANALYZER SYSTEM WITH ION SOURCE

(71) Applicant: MKS Instruments, Inc., Andover, MA (US)

(72) Inventors: Gerardo A. Brucker, Longmont, CO (US); Timothy C. Swinney, Fort Collins, CO (US); Clinton L. Percy, Windsor, CO (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/698,178

(22) Filed: Nov. 27, 2019

(51) Int. Cl.
| | | |
|---|---|---|
| *H01J 49/00* | (2006.01) | |
| *G01N 27/622* | (2021.01) | |
| *H01J 37/317* | (2006.01) | |

(52) U.S. Cl.
CPC ........ *G01N 27/622* (2013.01); *H01J 37/3171* (2013.01); *H01J 49/0031* (2013.01)

(58) Field of Classification Search
CPC . G01N 27/622; H01J 49/0031; H01J 37/3171
USPC .......... 250/281, 282, 288, 294–299
See application file for complete search history.

(56) References Cited

U.S. PATENT DOCUMENTS

| | | | |
|---|---|---|---|
| 2,770,772 A | 11/1956 | Foulkes et al. | |
| 3,342,990 A | 11/1967 | Barrington et al. | |
| 3,835,319 A | 9/1974 | Roehrig et al. | |
| 4,303,865 A | 12/1981 | Swingler | |
| 4,542,321 A | 9/1985 | Singh et al. | |
| 4,761,553 A * | 8/1988 | Juravic, Jr. ........... | G01M 3/205 250/281 |
| 4,774,437 A | 9/1988 | Helmer et al. | |
| 5,089,746 A | 2/1992 | Rosenblum et al. | |
| 5,157,333 A | 10/1992 | Peacock et al. | |
| 5,210,413 A | 5/1993 | Balzer | |
| 5,568,053 A | 10/1996 | Drubetsky et al. | |
| 6,761,804 B2 | 7/2004 | Perrin | |
| 7,098,667 B2 | 8/2006 | Liu | |
| 7,129,708 B1 | 10/2006 | Liu et al. | |
| 8,120,366 B2 | 2/2012 | Kawasaki | |

(Continued)

FOREIGN PATENT DOCUMENTS

| | | |
|---|---|---|
| DE | 102016105222 A1 | 5/2016 |
| EP | 3 100 020 B1 | 1/2019 |

(Continued)

OTHER PUBLICATIONS

Barrington, A.E., et al., "An Inverted Magnetron Helium Leak Detector," Journal of Vacuum Science and Technology, 2, pp. 198-202 (1965).

(Continued)

*Primary Examiner* — Michael Maskell
(74) *Attorney, Agent, or Firm* — Hamilton, Brook, Smith & Reynolds, P.C.

(57) ABSTRACT

A gas analyzer system uses an ionization source, which can be a hot cathode ionization source. A magnet assembly is positioned to define a magnetic field, which permits separation of ion components based on their mass to charge ratio. An ion beam deflector is used, such as a pair of deflector plates, which can scan ion components across a detector. The ion beam deflector defines a deflection electric field across the magnetic field and across a direction of travel of the ions emitted from the ionization source.

22 Claims, 12 Drawing Sheets

(56) References Cited

U.S. PATENT DOCUMENTS

| | | | |
|---|---|---|---|
| 8,324,904 | B2 | 12/2012 | Kawasaki |
| 8,384,391 | B2 | 2/2013 | Kawasaki et al. |
| 8,456,167 | B2 | 6/2013 | Key |
| 9,116,065 | B2 | 8/2015 | Andreaus |
| 9,316,555 | B2 | 4/2016 | Enomoto et al. |
| 9,588,004 | B2 | 3/2017 | Brucker et al. |
| 10,222,287 | B2 | 3/2019 | Kawasaki et al. |
| 2010/0259273 | A1 | 10/2010 | Kawasaki et al. |
| 2015/0091579 | A1 | 4/2015 | Brucker et al. |
| 2019/0368959 | A1* | 12/2019 | Brucker ............ G01M 3/205 |

FOREIGN PATENT DOCUMENTS

| | | |
|---|---|---|
| GB | 895602 | 5/1962 |
| WO | 2017/211627 A1 | 12/2017 |
| WO | 2019/231765 A1 | 12/2019 |

OTHER PUBLICATIONS

Blum, P., et al., "Cold Cathode Quadrupole Mass Spectrometer," The Review of Scientific Instruments, vol. 38, No. 10 (Oct. 1967).

Emlin, D.R., et al., "Cold-cathode source of ribbon gaseous ion beams," Review of Scientific Instruments, vol. 75, No. 5 (May 2004).

INFICON, Operating Manual, Inverted Magnetron Pirani Gauge, pp. 1-32 (Oct. 2008).

Torney, F.L., et al., "Lunar Mass Spectrometer Test Program," National Research Corporation for National Aeronautics and Space Administration, Final Report, 83 pages (1972).

Torney, F.L., et al., "Research and Development Program on the Use of Counting Techniques," National Aeronautics and Space Administration (Mar. 1971).

Uchatsch, S., et al., "A Comprehensive Solution for Vacuum Monitoring with a New Total and Partial Pressure Gauge," [retrieved from https://mkon.nu/RC_Data_FMS/Empire_data/files/file/All_Oral_Abstracts_v2.pdf], Oral Presentation # 2028-A-1902; VACOM Vakuum Komponenten & Messtechnik GmbH, Großlöbichau, Germany IVC-21, Malmo, Sweden. IVC is the International Vacuum Conference that is organized by IUVSTA the International Union for Vacuum Science, Technique and Applications (Jul. 1-5, 2019).

International Search Report and Written Opinion for International Application No. PCT/US2019/033343, entitled "Gas Analysis with an Inverted Magnetron Source", dated Nov. 7, 2019.

Invitation to Pay Additional Fees for International Application No. PCT/US2019/033343, entitled "as Analysis with an nverted Magnetron Source", dated Sep. 12, 2019.

* cited by examiner

GAS ANALYZER SYSTEM WITH ION SOURCE

BACKGROUND

There is an ongoing need to facilitate trouble shooting in high vacuum processes. High vacuum processes typically follow a workflow that starts with a pump down of a vacuum chamber from atmospheric pressure. The user tracks the pressure of the vacuum chamber during the pump down and, when the total pressure meets a target pressure, the vacuum process or experiment can start. There is generally an expectation that the target pressure will be met within a pre-specified time range. If the target pressure is not reached after an expected period of time, or it takes longer than usual to reach it, the vacuum system user needs to troubleshoot the vacuum chamber. Often, troubleshooting requires not only using an ionization gauge, but also the need to break vacuum to use a helium leak detector, and sometimes, to use an expensive Residual Gas Analyzer to measure water levels.

There is, therefore, an ongoing need to provide equipment that reduces the time and expense involved in troubleshooting high vacuum processes. In addition, there is a need for improved systems for helium leak detection, water percentage determination, magnetic sectors, quadrupole mass filters and other systems that use an ionization source.

SUMMARY

A gas analyzer system uses an ionization source, which can be a hot cathode ionization source; a magnet assembly positioned to define a magnetic field, which permits separation of ion components based on their mass to charge ratio; and an ion beam deflector, such as a pair of deflector plates that can scan ion components across a detector. The ion beam deflector defines a deflection electric field across the magnetic field and across a direction of travel of the ions emitted from the ionization source. The arrangement can provide ions with a narrow energy distribution that can produce a mass spectrum with sharp peaks, having high resolution. Other advantages are described further below.

A gas analyzer system comprises an ionization source configured to create a source electric field in an ionization region of the ionization source. The ionization region receives a gas from a monitored chamber such that ions of the gas are formed in the ionization source. A source aperture is positioned to emit a portion of the ions of the gas out of the ionization source, the ions being accelerated by the source electric field in a direction towards the source aperture. A magnet assembly is positioned to define a magnetic field to angularly displace the emitted portion of the ions based on a mass to charge ratio of ions of the gas. An ion beam deflector is positioned between the source aperture and the detector, the ion beam deflector defining a deflection electric field across the magnetic field and across a direction of travel of the emitted portion of the ions. A detector is positioned to detect a displaced ion component of the emitted portion of the ions. Ion current measurement circuitry is electrically connected to measure a current produced from receipt of the displaced ion component at the detector.

The ionization source may comprise a cold cathode ionization source or a hot cathode ionization source. The hot cathode ionization source may comprise a hot filament and an electron collector configured to create an electron beam through the ionization source between the hot filament and the electron collector. The hot filament and the electron collector may be configured to create the electron beam in a direction parallel to the source aperture, the source aperture comprising an aperture elongated in the direction parallel to the electron beam. The system may further comprise an energy filter. The source aperture may comprise an elongated aperture, and the energy filter may comprise an energy filter grid positioned in an ion beam path of the emitted portion of the ions, the energy filter grid comprising conductive filaments oriented substantially perpendicular to the elongated aperture of the source aperture, and comprising substantially no conductive filaments oriented substantially parallel to the elongated aperture of the source aperture. The energy filter may comprise an entry grid positioned between the source aperture and an entry of an ion beam of the emitted portion of the ions into the ion beam deflector; and may comprise an exit grid positioned between an exit of an ion beam of the emitted portion of the ions out of the ion beam deflector, and the detector aperture.

The ion beam deflector may be configured to align an ion beam of the emitted portion of the ions on the detector. The ion beam deflector may comprise a pair of parallel plates, and may comprise a pair of curved plates. The source aperture may be positioned to emit a portion of the ions of the gas out of the ionization source to enter the ion beam deflector closer to one side of the ion beam deflector than a geometrical center of the ion beam deflector. A deflector power supply may be electrically connected to the ion beam deflector to create the deflection electric field between a pair of deflector plates of the ion beam deflector. The deflector power supply may be electrically connected to (i) provide a positive deflector bias voltage to a first deflector plate of the ion beam deflector relative to a ground voltage of a second deflector plate of the ion beam deflector, or (ii) provide a negative deflector bias voltage to the first deflector plate relative to the ground voltage of the second deflector plate, or (iii) provide a first deflector bias voltage to the first deflector plate and a second deflector bias voltage to the second deflector plate.

A deflector control circuit may be configured to supply a deflector control signal to the deflector power supply. The deflector control circuit may be configured to control a voltage of the deflector power supply to cause the ion beam deflector to direct displaced ion components having different energies and a common ion component mass to be focused through a detector aperture of the detector. The deflector control circuit may be configured to vary a voltage of the deflector power supply to cause the ion beam deflector to vary a deflection of the displaced ion component of the emitted portion of the ions. The voltage of the deflector power supply may be varied based on (i) a triangular sawtooth variation of the voltage with time, or (ii) a voltage waveform to control a peak width and temporal position, relative to other ion components, of the displaced ion component. The deflector control circuit may be configured to scan a voltage of the deflector power supply to cause the ion beam deflector to deflect plural ion components to be detected by the detector in succession as the voltage of the deflector power supply is scanned; and may be configured to scan the voltage of the deflector power supply to permit detection of a mass spectrum of the plural ion components. Total current measurement circuitry can be electrically connected to measure a total ion current of the ionization source.

BRIEF DESCRIPTION OF THE DRAWINGS

The foregoing will be apparent from the following more particular description of example embodiments, as illus

DETAILED DESCRIPTION

A description of example embodiments follows.

In a prior application naming some of the inventors of the present application, there was disclosed a cold cathode ionization source for a gas analyzer system; see U.S. patent application Ser. No. 16/397,436 of Brucker et al., filed Apr. 29, 2019, entitled "Gas Analysis with an Inverted Magnetron Source," the entire teachings of which are incorporated herein by reference. The disclosure of that application taught the use of a cold cathode ionization source in which a magnetic field is oriented across an electric field, and the use of an ion beam deflector to permit sweeping of an ion beam and ion components across a detector aperture, thereby permitting generating a spectrum of ion components.

Although the cold cathode ionization sources taught in that application provide many benefits, the teachings of that application can be extended to a hot cathode ionization source. Also, additional features can be applied to both hot cathode and cold cathode ionization sources. Taught herein is a gas analyzer system that uses an ionization source, which can be a hot cathode ionization source. A magnet assembly is positioned to define a magnetic field, which permits separation of ion components based on their mass to charge ratio. An ion beam deflector is used, such as a pair of deflector plates, which can scan ion components across a detector. The ion beam deflector defines a deflection electric field across the magnetic field and across a direction of travel of the ions emitted from the ionization source. Among other potential advantages, ions are generated with a narrower energy distribution, which produces sharper peaks in the mass spectrum, thereby providing high resolution. Other potential advantages are taught herein.

Figure 1:
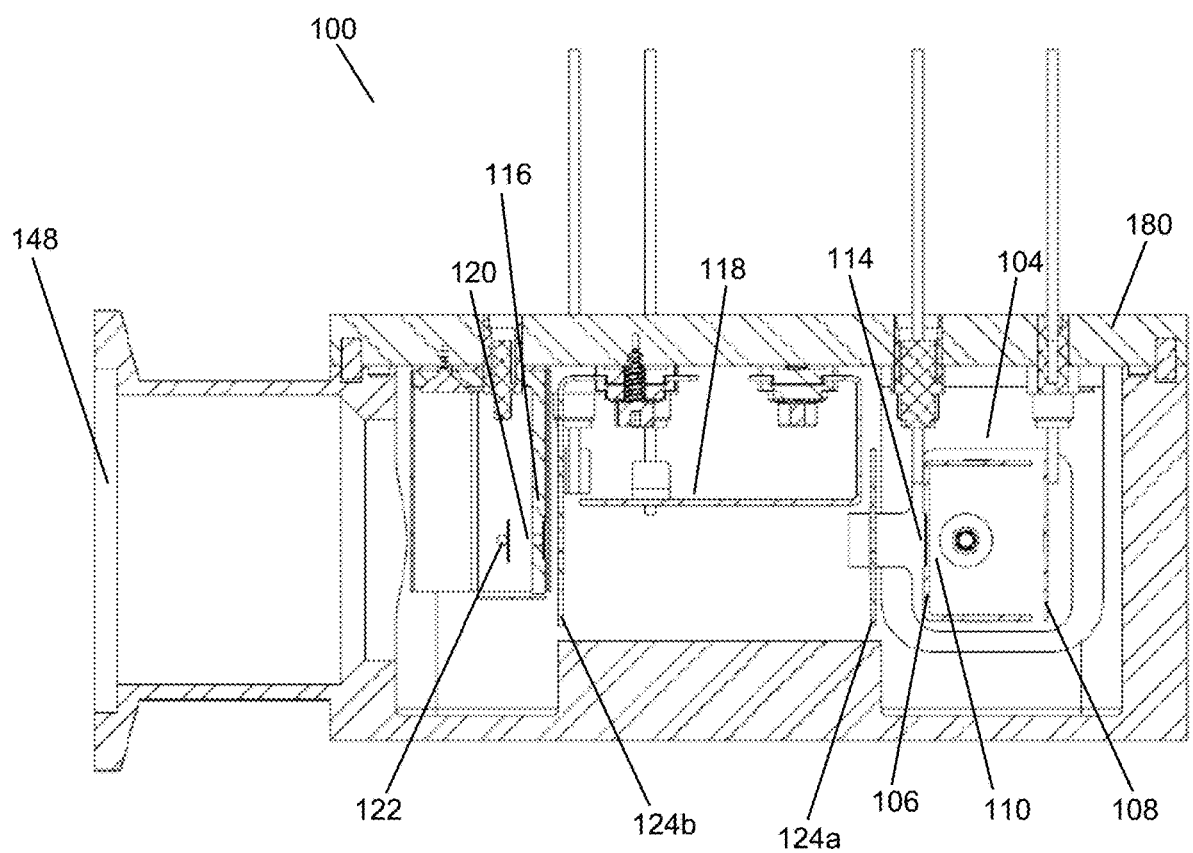
- FIG. 1 is a top view of a gas analyzer system, showing interior components within a cutaway view of the enclosure, in accordance with an embodiment of the invention.
Figure 2:
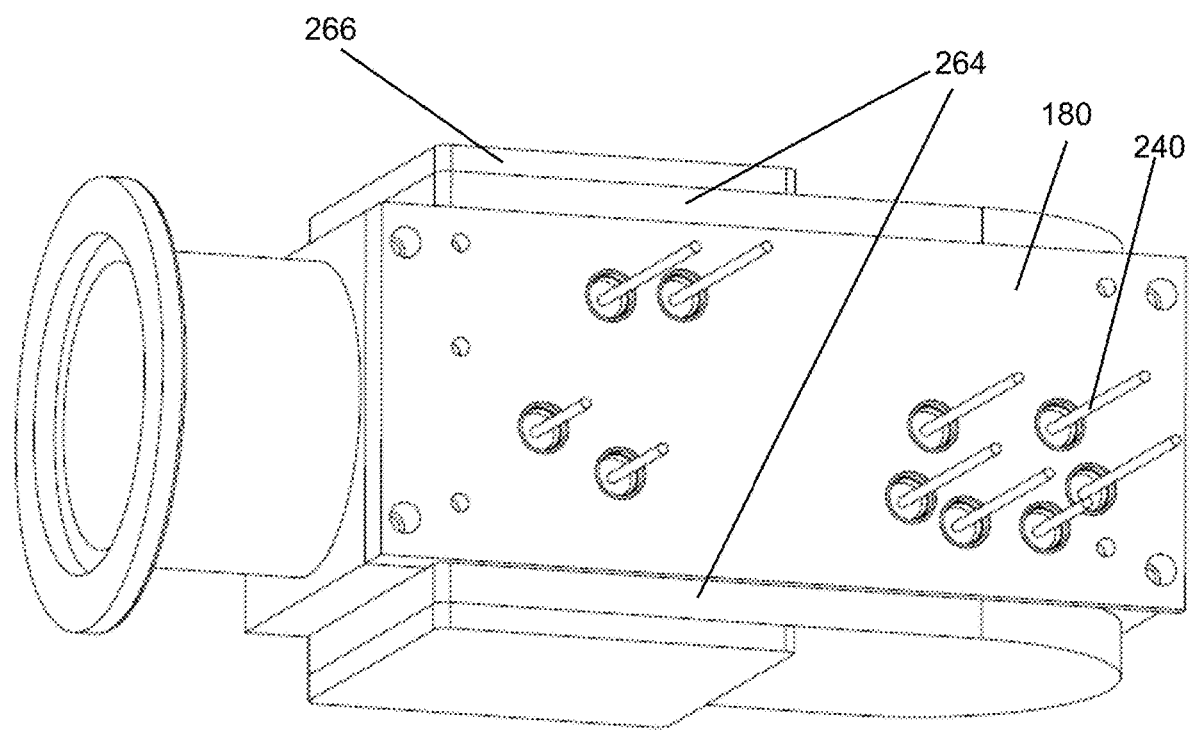
FIG. 2 is a perspective view of an exterior of the enclosure of the gas analyzer system of FIG. 1, showing a magnet assembly used with the gas analyzer system, in accordance with an embodiment of the invention.
Figure 3:
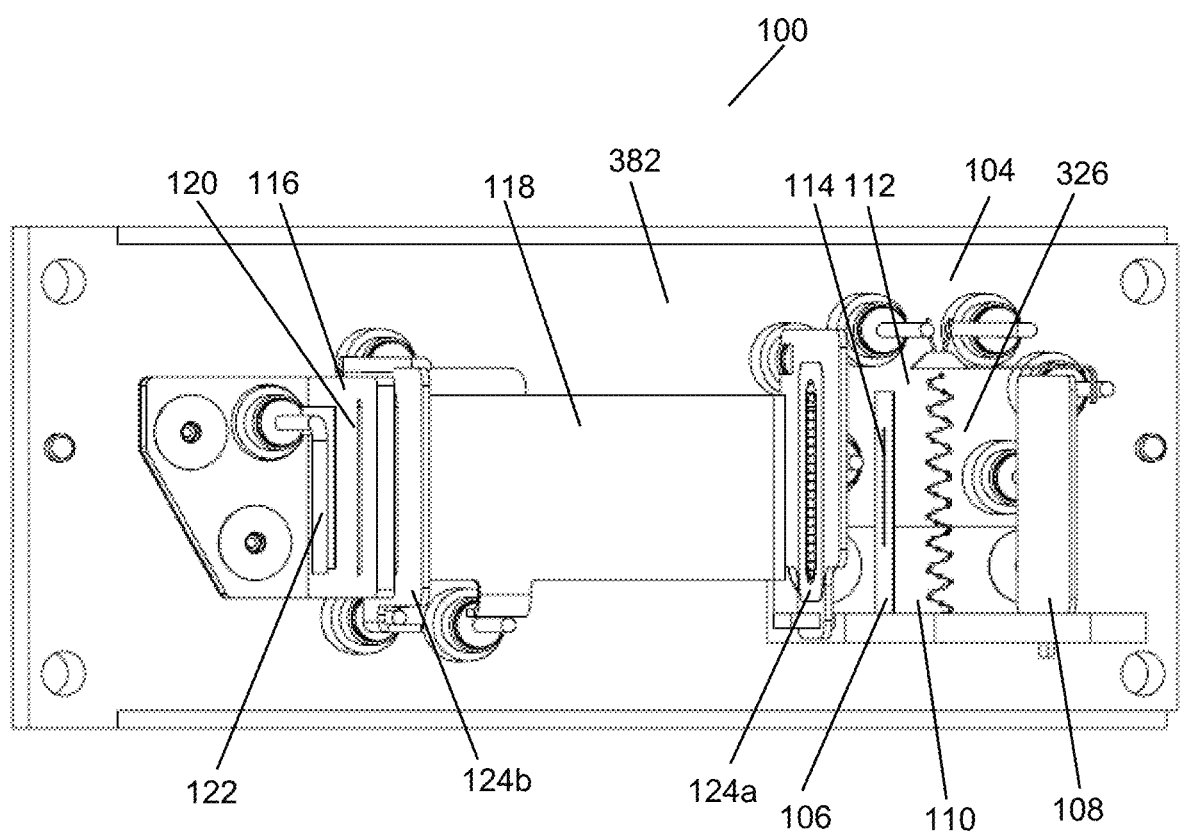
FIG. 3 is a side perspective view of interior components and a side wall of the gas analyzer system of FIG. 1, in accordance with an embodiment of the invention.

The gas analyzer system will first be described with reference to FIGS. 1-3, in which FIG. 1 is a top view of a gas analyzer system 100, showing interior components within a cutaway view of the enclosure 180. FIG. 2 is a perspective view of an exterior of the enclosure 180, showing a magnet assembly 264; and FIG. 3 is a side perspective view of interior components and a side wall 382 of the system.

In FIG. 1, the gas analyzer system 100 comprises an ionization source 104 configured to create a source electric field in an ionization region 110 of the ionization source 104. In FIG. 1, for example, the source electric field may be directed from right to left, between a source pusher electrode 108 and an anode electrode 106. The ionization region 110 receives a gas from a monitored chamber such that ions of the gas are formed in the ionization source 104. A source aperture 114 is positioned to emit a portion of the ions of the gas out of the ionization source 104, and can be an aperture formed in a portion of the anode electrode 106. The ions are accelerated by the source electric field in a direction towards the source aperture 114. A magnet assembly 264 (see FIG. 2) is positioned to define a magnetic field to angularly displace the ions emitted from the source aperture 114 (FIG. 1) based on a mass to charge ratio of the ions, for example by defining the magnetic field across a flight region of the emitted ions, as shown at 860 in FIG. 8, below. As will be shown relative to FIGS. 3 and 4, an electron beam 326 is created through the ionization source 104 of FIG. 1. The electron beam collides with the gas molecules to form the ions of the gas in the ionization source 104. The anode electrode 106 can be extended to form walls that substantially surround the ionization source 104, other than the source pusher electrode 108. In another embodiment, the ionization source 104 can be made of wire mesh material, so that it is open to passage of gas. In this case, solid walls of the ionization source 104 are replaced with perforated metal or sintered wire mesh. The source aperture 114 of FIG. 1 can, for example, have a width of about 0.005 inches, although it will be appreciated that other dimensions can be used.

A vacuum port 148 permits gas from the monitored chamber to enter the gas analyzer system from the monitored chamber, so that the gas travels in a counter-flow direction to the ion beam, that is, the gas travels in the direction from the detector 116 towards the source aperture 114. At the ionization source 104, the gas enters the ionization source 104 (for example, through an opening in the top of the ionization source 104 or in some versions through open or perforated sides of the ionization source 104), and then is ionized inside the ionization source 104 to form the ion beam, which is emitted in the reverse direction, that is, the ion beam travels from the source aperture 114 towards the detector 116.

FIG. 2 is a perspective view of an exterior of the enclosure of the gas analyzer system of FIG. 1, showing a magnet assembly 264 used with the gas analyzer system, in accordance with an embodiment of the invention. The magnet assembly 264 can include a monolithic magnet that extends over the ionization source and extends in a direction extending longitudinally from the source aperture towards the detector. In the example of FIG. 2, two monolithic magnets are shown (top and bottom), sandwiching the region of the flight path of the ions between the source aperture and the detector, which helps to create a uniform magnetic field in the flight path region. The magnetic field provided by the magnet assembly 264 can, for example, be 1 kGauss throughout, and can provide enough separation of the ion components to see water separate from other residual gases. Further magnetic strength in the flight path, for additional mass separation, can be obtained with the addition of another magnet 266 over the flight path, or a magnetic yoke, or both. In the hot cathode ionization source embodiment of FIGS. 1-3, the magnet assembly 264 can also be extended over the ionization source 104 (see FIG. 1), in addition to the region of flight of the ions between the source aperture and the detector, but it need not be. An advantage of extending the magnet assembly 264 over the ionization source 104 is that adding a magnetic field over the electron beam 326 (see FIG. 3) increases the circular orbits of the electrons, which increases the electron trajectory length. However, in some hot cathode ionization source embodiments, the magnet assembly 264 extends only over the region of flight of the ions between the source aperture and the detector. By contrast, in a cold cathode ionization source embodiment, shown in FIG. 11, below, the magnet assembly 264 is required to define a cross-field arrangement across an electric field within the cold cathode ionization source, and can be extended over the region of flight of the ions between the source aperture and the detector, in order to encourage mass separation of the ions. Also shown in FIG. 2 are electrical feedthroughs 240 (see also FIGS. 5 and 6), which can all extend through one side wall.

A detector 116 (see FIG. 1) is positioned to detect a displaced ion component of the emitted portion of the ions. The detector 116 can, for example, include a detector aperture 120, which can have a width of about 0.010 inches, although it will be appreciated that other dimensions can be used. The detector 116 can also include a Faraday collector 122. The detector aperture 120 can be voltage biased so that it acts as an energy filter of the ions. Other types of energy filter can be used, as discussed, for example, for energy filter grids 124a/124b, below, and through biasing of a detector shield 1198 (in FIG. 11, discussed below).

An ion beam deflector 118 is positioned between the source aperture 114 and the detector 116. The ion beam deflector 118 defines a deflection electric field across the magnetic field (see direction 860 in FIG. 8) and across a direction of travel of the ions emitted from the source aperture (that is, across the direction of travel from source aperture 114 to detector aperture 120 in FIG. 1). For example, in FIG. 1, the deflector 118 can define the deflection electric field in a direction from the top to bottom of FIG. 1. Ion current measurement circuitry (not shown in FIG. 1, see 970 in FIG. 9) is electrically connected to measure a current produced from receipt of the displaced ion component at the detector 116.

In addition, the system of FIG. 1 includes an energy filter, such as energy filter grids 124a and 124b, positioned in the ion beam path. The energy filter grid 124a is an entry grid, which is positioned between the source aperture 114 and the entry of the ion beam into the ion beam deflector 118. The energy filter grid 124b is an exit grid, which is positioned between the exit of the ion beam from the ion beam deflector 118, and the detector aperture 120. It will be appreciated that one or both of the entry grid 124a and exit grid 124b can be used.

FIG. 3 is a side perspective view of interior components and a side wall 382 of the system. Here, it is noted that, in some embodiments, the interior components of the system can be conveniently mounted to the side wall 382, for ease of assembly, with electrical feedthroughs (see 240 in FIGS. 2, 5 and 6) all extending through one side wall. In addition, it is noted that side wall 382 (see FIGS. 3-7) and base plate 480 (see, for example, FIG. 4) can form a portion of the enclosure 180 (see FIGS. 1 and 2).

Figure 4:
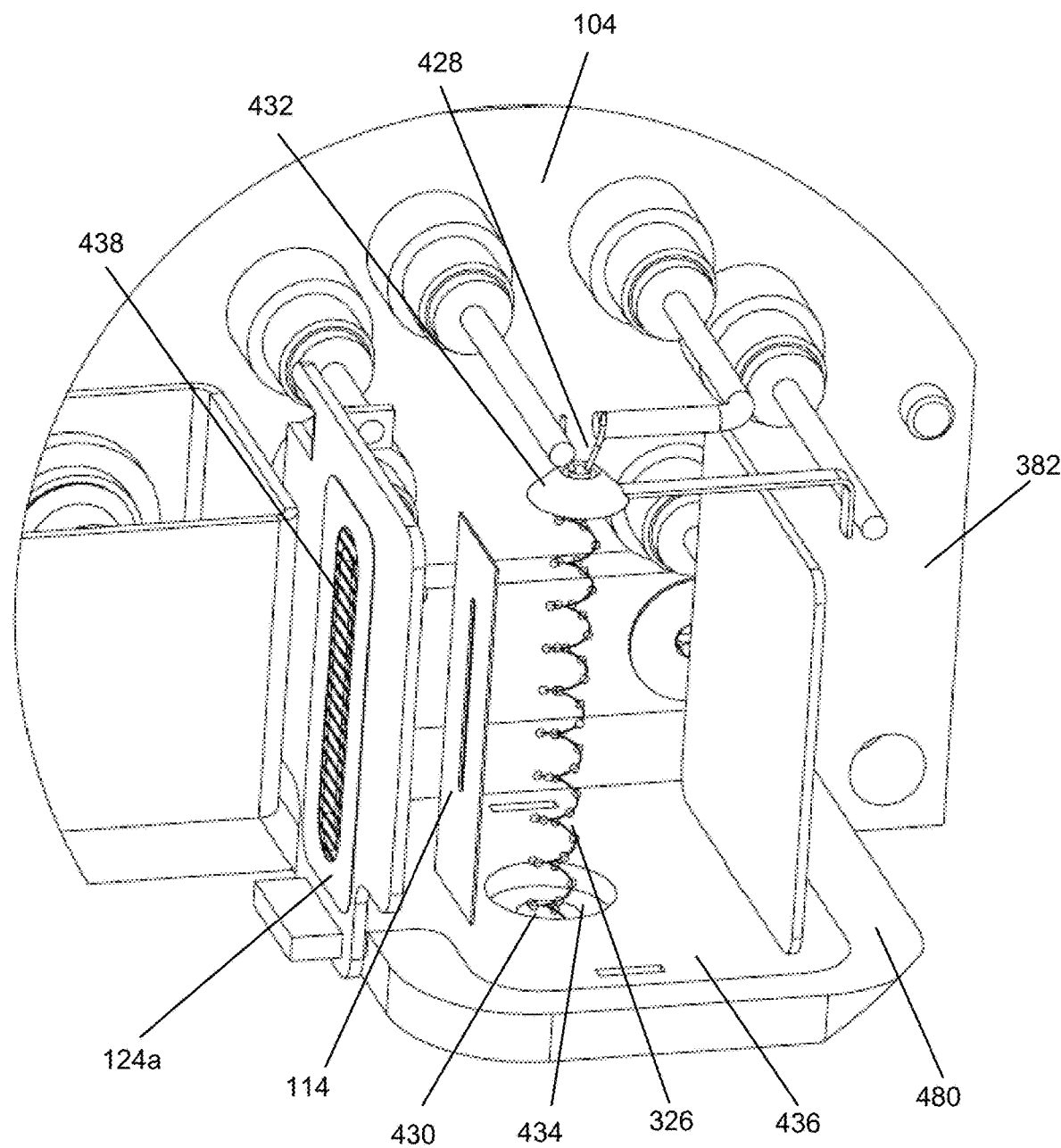
FIG. 4 is a perspective view of the ionization source of the gas analyzer system of FIG. 1, in accordance with an embodiment of the invention.

FIG. 4 is a perspective view of the ionization source 104 of the gas analyzer system of FIG. 1, in accordance with an embodiment of the invention. The ionization source 104 can be a hot cathode ionization source, which can include a hot filament 428 (or other hot cathode ionization source) and an electron collector 430 configured to create an electron beam 326 through the ionization source 104 between the hot filament 428 and the electron collector 430. A filament deflector 432 focuses the electron beam 326. The electrons in the electron beam 326 precess in circular trajectories, due to the magnetic field across the ionization source. An exit hole 434 is formed in an insulator 436, which forms the bottom of the ionization source 104. The hot filament 428 and the electron collector 430 can be configured to create the electron beam 326 in a direction parallel to the source aperture 114, where the source aperture 114 is elongated in the direction parallel to the electron beam; for example, in FIG. 4, both the electron beam 326 and the source aperture 114 are aligned vertically in FIG. 4. The most efficient electron ionization design introduces the electrons parallel to the magnetic field and the source aperture orientation. The ions that can reach the source aperture should be originated within a narrow range of potential energies, that is, in a flat equipotential region of the source, which can be found using modeling.

As shown in FIG. 4, the entry grid 124a can include conductive filaments 438 oriented substantially perpendicular to the elongated aperture of the source aperture 114—that is, horizontally in FIG. 4, where the source aperture 114 is oriented vertically—with no conductive filaments (or substantially no filaments) being oriented substantially parallel to the elongated aperture of the source aperture 114—that is, no filaments oriented vertically in FIG. 4. In this way, no grid lines interfere with the path between the source aperture and the detector aperture, for example where a vertical ribbon beam is being scanned horizontally across the grid mesh, which would encounter interference if vertical filaments are used in the conductive mesh. This arrangement can, for example, provide a doubling of signal sensitivity with no impact on resolution or peak position. The exit grid (see 124b in FIG. 1) can use the same arrangement of conductive filaments 438 (FIG. 4) oriented substantially perpendicular to the elongated aperture of the source aperture 114.

Figure 5:
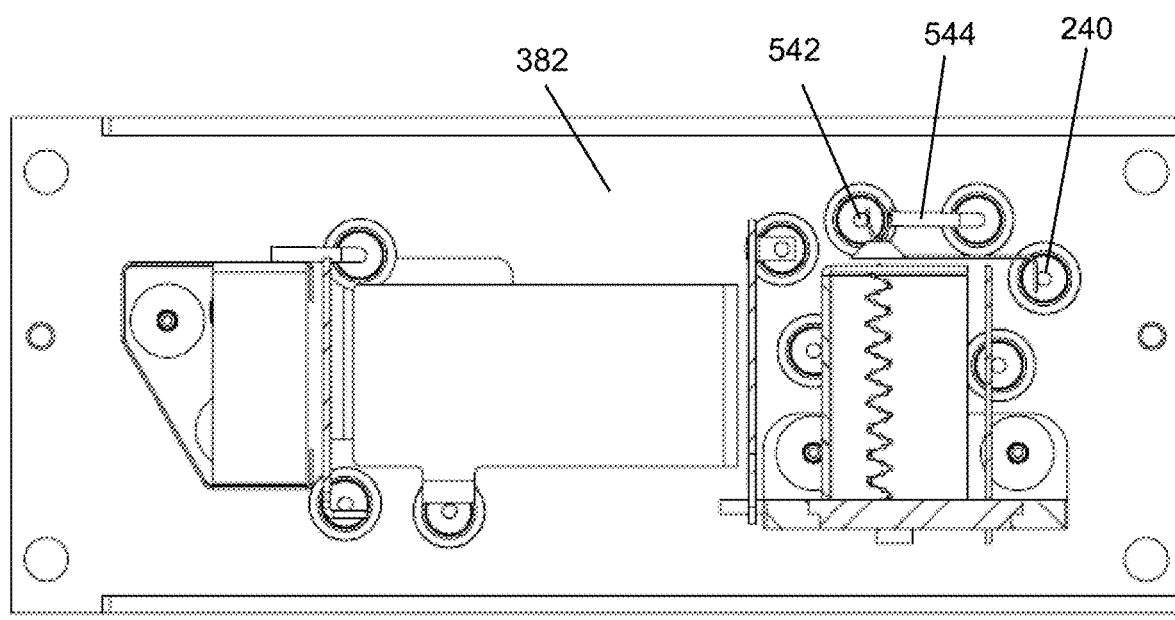
FIG. 5 is a side view of interior components and a side wall of the gas analyzer system of FIG. 1, in accordance with an embodiment of the invention.

FIG. 5 is a side view of interior components and a side wall of the gas analyzer system of FIG. 1. Several electrical feedthroughs 240 (which are not enumerated separately) permit carrying of electrical signals and power into and out of the enclosure of the gas analyzer system. A filament supply 542 and filament return 544 carry power to and from the hot filament.

Figure 6:
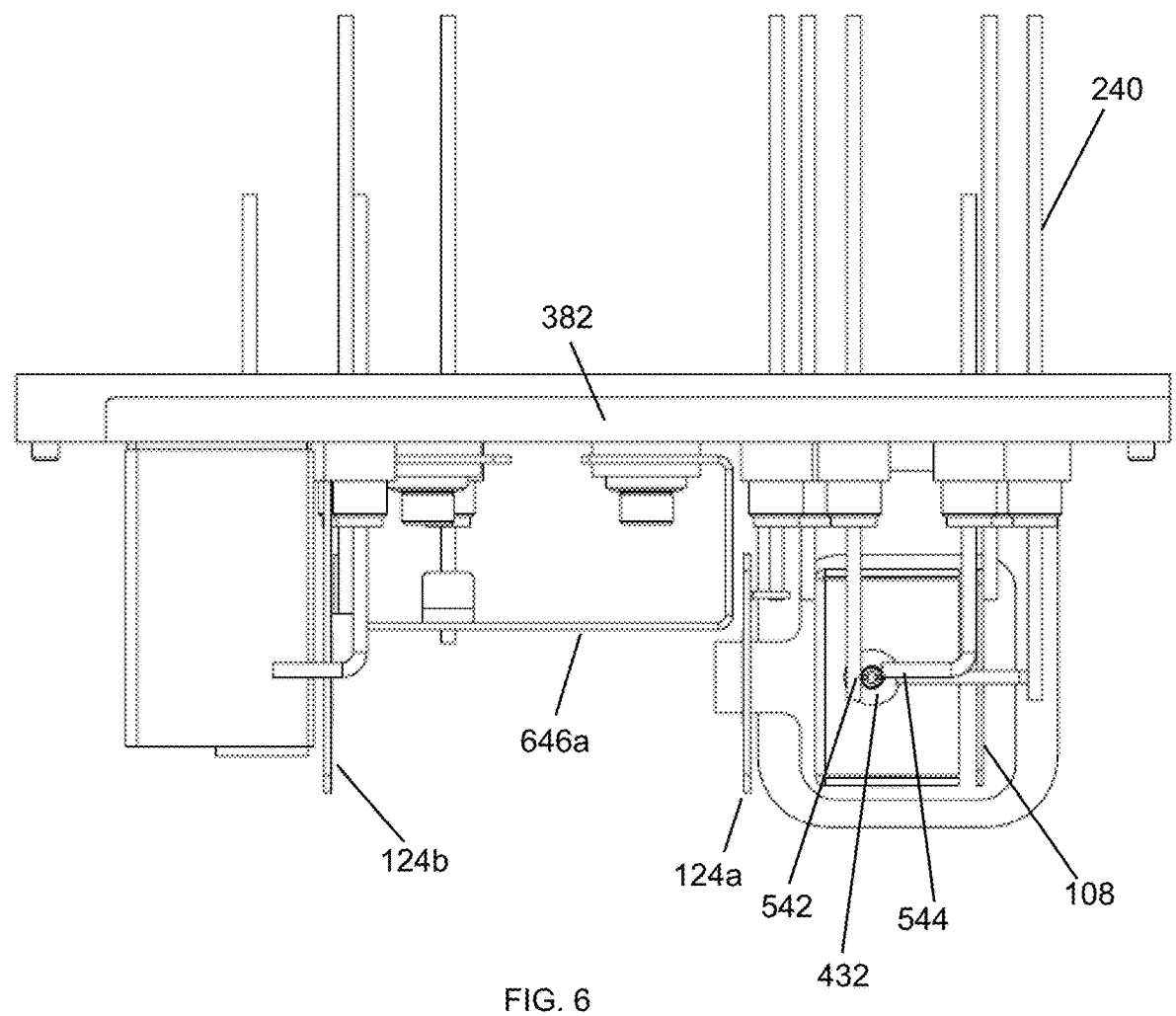
FIG. 6 is a top view of interior components and a side wall of the gas analyzer system of FIG. 1, in accordance with an embodiment of the invention.

FIG. 6 is a top view of interior components and a side wall of the gas analyzer system of FIG. 1, in accordance with an embodiment of the invention. This view shows the electrical feedthroughs 240 extending from outside the enclosure of the gas analyzer system and into the interior of the enclosure. Also shown in this top view are the source pusher electrode 108, the filament supply 542 and filament return 544, each with their own electrical feedthrough, and the filament deflector 432. Also shown in FIG. 6 is a deflector plate 646a, which is one of a pair of parallel plates that form the ion beam deflector 118 (of FIG. 1), where the other plate (see 746b in FIG. 7) is not shown in FIG. 6. As shown in FIG. 6, the entry grid 124a and exit grid 124b are positioned at the entry and exit, respectively, of the ion beam into and out of the ion beam deflector, that is, here, between the electrode deflector plate 646a and its corresponding parallel plate (see 746b in FIG. 7, not shown in FIG. 6).

Figure 7:
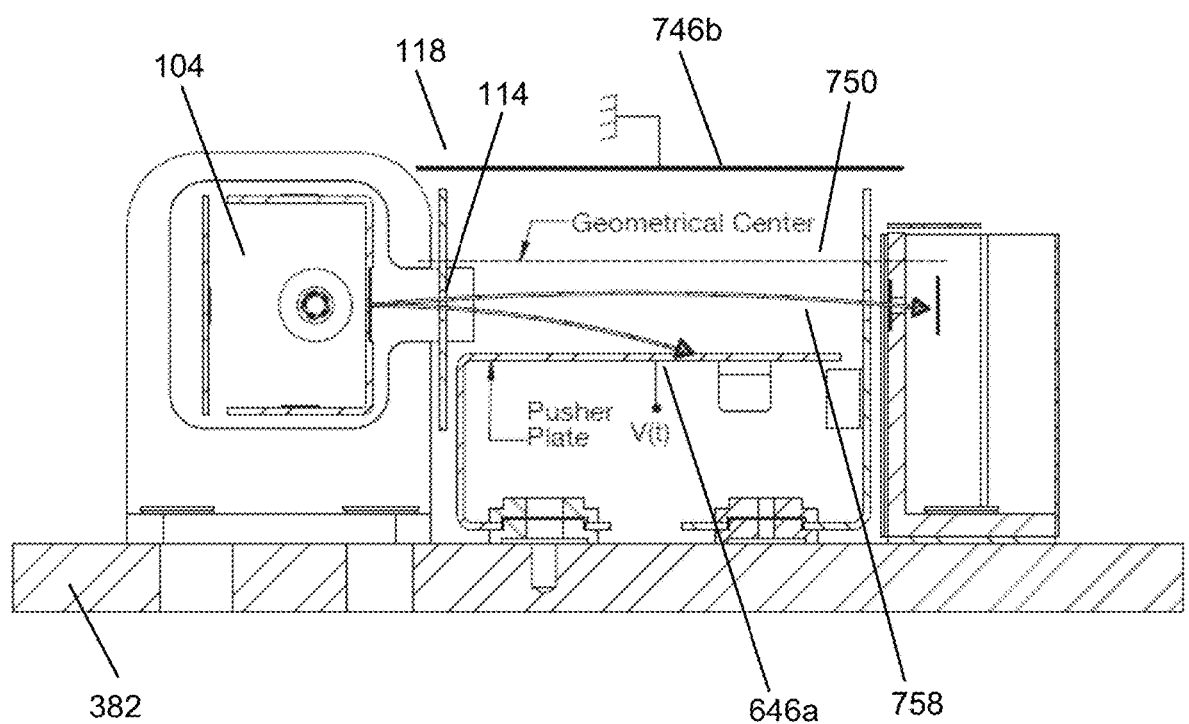
FIG. 7 is a schematic diagram showing off-center operation of deflector plates, in accordance with an embodiment of the invention.

FIG. 7 is a schematic diagram showing off-center operation of deflector plates 646a/746b, in accordance with an embodiment of the invention. Here, the source aperture 114 is positioned to emit the ion beam 758 out of the ionization source 104 to enter the ion beam deflector 118 closer to one side of the ion beam deflector 118 than a geometrical center 750 of the ion beam deflector 118. This arrangement provides several potential benefits. By decreasing the distance to the deflector plate to which voltage is applied, the voltage required on the deflector plate is lower, which saves costs on power supplies, reduces the ratings required for electrical feed-throughs, and increases the reliability of components. In addition, equipotential lines are flatter, closer to the deflector plates, and thus the ion beam is less distorted along its flight path.

Figure 8:
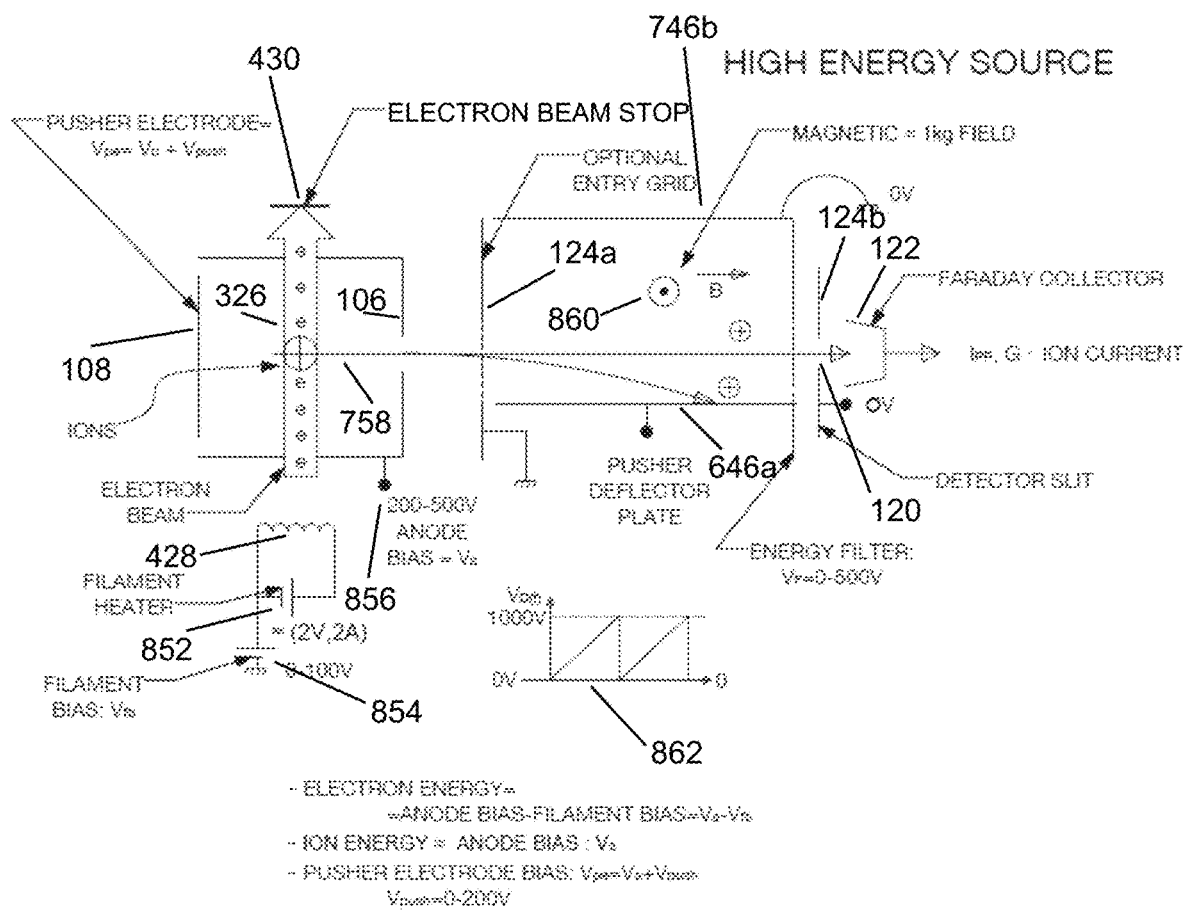
FIG. 8 is a schematic diagram of a gas analyzer system in accordance with an embodiment of the invention, showing electrical components and an ion beam path through a magnetic field.

FIG. 8 is a schematic diagram of a gas analyzer system in accordance with an embodiment of the invention, showing electrical components and an ion beam path through a magnetic field. The system includes a source pusher electrode 108 biased at a voltage $V_{PE}=V_a+V_{PUSH}$ where $V_{PE}$ is the voltage of the source pusher electrode 108, $V_a$ is the voltage of anode electrode 106, and $V_{PUSH}$ is the bias voltage of the source pusher electrode 108, which can for example be as much as 200 V. The electron beam 326 travels between the hot filament 428 and the electron collector 430. A filament heater voltage 852 is set at, for example 2V at a current of 2 A. A filament bias voltage 854, $V_{FB}$, is for example between 0 and 100 V. The anode bias voltage 856, $V_a$, is, for example between 200 V and 500 V. The ion beam 758 is emitted through the entry grid 124a, and travels between the deflector plates 646a/746b. The magnetic field direction 860 is shown, and the magnetic field may have a magnitude of, for example, about 1 kGauss. (It is noted that, for ease of illustration, the orientation of the electron beam 326 in FIG. 8 is shown vertically on the page, when in other embodiments shown herein it would be oriented coming out of the page, in order to be parallel with the elongated source aperture as shown elsewhere herein). One deflector plate 646a, the pusher deflector plate, is biased at a voltage 862, V(t), which in this example is a sawtooth pattern voltage that peaks at about 1000 V, while the other deflector plate 746b is at ground voltage. The exit grid 124b is biased, for example, at $V_F$=0–500 V. The detector aperture 120 is biased at ground voltage. In another example, energy filtering can be produced by keeping the exit grid 124b at ground, and biasing the detector aperture 120 instead. The Faraday collector 122 receives a detected portion of the ion beam 758 and generates a detected ion current, $I_{PP,G}$, which can, for example, be used to measure a partial pressure of the ion component that is detected at the detector aperture 120.

In the embodiment of FIG. 8, the high energy source design generates the ions within an ionization volume biased at high voltage. The source pusher electrode 108 forces the ions out through the thin aperture of the source aperture into the magnetic sector. The ions exit the source and gain high kinetic energy before flying through the mass separator, which is held at ground potential when the deflector plates 646a/746b are off. The bias of the source can be adjusted to control the energy of the ions through the magnetic sector. This design has the advantage that the entire flight path is held at ground potential and only the source needs to be floated. Depending on the voltage bias for the ionization region, it is often possible to run the filaments close to ground potential with the electrons gaining high energies as they enter the source.

In FIG. 8, ions are generated inside the anode in the ionization region defined by the electron beam 326. Since the potential is well defined within the ionization band, the ion energy distribution is very narrow. In order to get the most efficient ionization, the electron beam 326 can be parallel to the magnetic field 860 (again, it is noted that for ease of illustration the source in FIG. 8 is shown in the plane of the page, but can be parallel to direction 860 of the magnetic field), so that the electrons precess in circular trajectories and have longer ionization trajectory. The ions formed inside the anode 106 are pushed towards the source aperture by the source pusher electrode 108. The electrons accelerate as they go to the anode 106, reaching an energy equal to the difference in voltage between the anode 106 and filament bias 854. The electron beam 326 traverses the ionization region in a band located close to the anode aperture 114 (see FIG. 1). This makes the ions be formed at an equipotential region that provides a narrow energy distribution.

Figure 9:
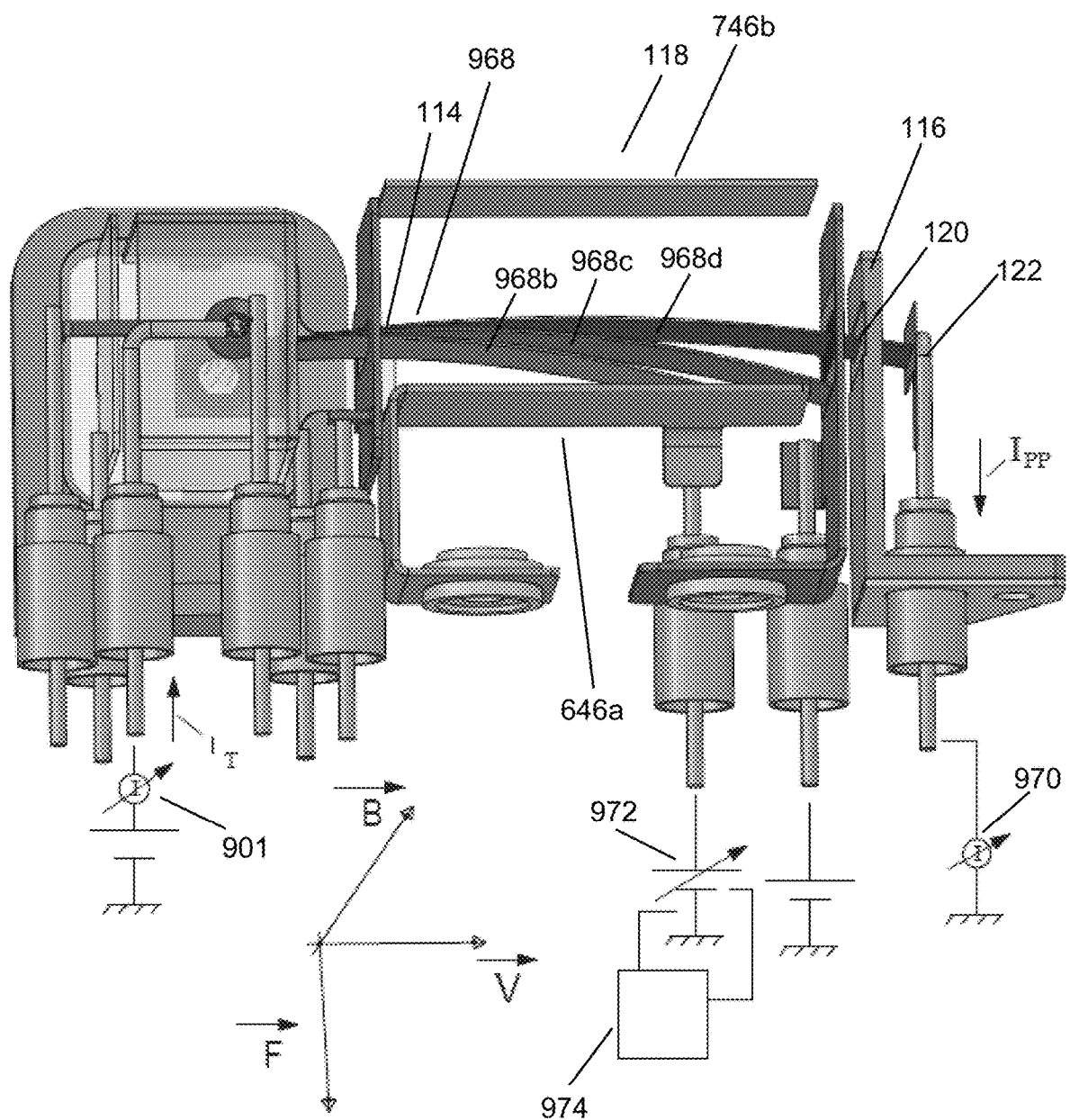
FIG. 9 is a schematic perspective diagram of a gas analyzer system that uses an ion beam deflector to deflect ion components to be detected by the detector, in accordance with an embodiment of the invention.

FIG. 9 is a schematic perspective diagram of a gas analyzer system that uses an ion beam deflector 118 to deflect ion components to be detected by the detector, in accordance with an embodiment of the invention. The ion beam deflector 118, such as a pair of parallel plates 646a and 746b, or a pair of curved plates (see 646a and 746b in FIG. 12), is positioned between the source aperture 114 and the detector 116. Such an ion beam deflector 118 can be used to deflect ion components, and to perform energy focusing, as will be discussed further below. Displaced ion components 968 are separated into different ion components, which diverge increasingly from each other as they travel further from the source aperture 114. The source aperture 114, such as a vertical slit, allows a thin sliver of ion components 968 to exit the source. Using magnets 264 (see FIG. 2), the magnetic field in the ion flight region between the source aperture 114 and the detector 116 produces mass dependent deflection of the ions into separate ion components 968b-d. Lighter ions are deflected more than heavier ions. For example, a displaced ion component 968b is made of helium ions, 968c is made of water ions, and 968d is made of residual gases, such as nitrogen and oxygen. Such increased deflection of the ion components using additional magnets can, for example, allow the separation of water ions from the rest of the residual gas ions 968d. The detector 116 includes a metallic Faraday collector 122 that produces an ion current proportional to the ion flux reaching the detector 116 through the detector aperture 120. This ion current is the partial pressure current, $I_{PP}$, of the ion component 968d that reaches the detector. Ion current measurement circuitry 970, is used to measure the partial pressure current. This partial pressure can be used to provide an indication of a partial pressure of a gas from the monitored chamber, specifically the mass separated ion component 968d that reaches the detector. In addition, total current measurement circuitry 901 can be electrically connected to measure a total ion current of the ionization source. For example, total current measurement circuitry 901 can measure a total current that is proportional to the total ion current flowing from the ionization source, which can be used to determine the total pressure of the gas from the monitored chamber. For example, as shown in FIG. 9, the total current measurement circuitry 901 can measure the total current flowing into the ionization source (here, into the hot filament of the hot source), but the total current measurement circuitry 901 can instead measure the total current in another way, such as by measuring the current flowing through anode 106. Based on the partial pressure current and total pressure current, a total pressure display, in electrical connection with the total current measurement circuitry 901, can provide an indication (such as a visual indication) of a total pressure of the gas from the monitored chamber; and a partial pressure display, in electrical connection with the ion current measurement circuitry 970, can provide an indication (such as a visual indication) of a partial pressure of a gas from the monitored chamber.

In addition, in the embodiment of FIG. 9, the ion beam deflector 118 is used to steer the ion components 968*b-d* into the detector aperture 120. Whereas, the magnetic field curves the trajectories of the ion components downwards (with reference to the top view of FIG. 9), the electric field between the deflector plates 646*a* and 746*b* electrostatically steers the ion component trajectories upward, with reference to FIG. 9, assuming a "pusher" arrangement in which deflector plate 646*a* is positively biased relative to a grounded deflector plate 746*b*. In FIG. 9, for example, a voltage difference between the deflector plates 646*a* and 746*b* is set such that the residual gas component 968*d* is detected. With both deflector plates 646*a* and 746*b* at ground, all ions would miss the detector aperture 120, based on the angle of the source aperture and the amount of deflection of the ion components from the magnetic field. But as a voltage of one of the deflector plates, here, a pusher deflector plate 646*a*, is changed (here, increased in a positive direction) relative to the other deflector plate 746*b*, which in this example is grounded, the ion components 968*b-d* are steered up (or down depending on the voltage change), allowing different ion components to clear the detector aperture 120. In FIG. 9, the pusher deflector plate 646*a* is set to a voltage such that the residual gas ion component 968*d* reaches the detector aperture 120. With a further increase of the voltage on the deflector plate 646*a*, the water ion component 968*c* or helium ion component 968*b* would reach the detector aperture 120 and produce a signal. Thus, the deflector 118 permits ion component steering, so that multiple ion component species can be brought sequentially to a detector 116. In the example of FIG. 9, the deflector plate 646*a* is a pusher deflector plate, which is swept with a positive voltage relative to the grounded deflector plate 746*b*. Other arrangements can be used; for example, one plate can be at a negative voltage relative to the other plate, which is grounded; or both plates can be biased at different voltages. In the example of FIG. 9, for a pusher deflector plate, ion components can, for example, emerge out of the source aperture 114 and fly towards the pusher deflector plate 646*a*, based on the deflection caused by the magnetic field. In this example, with the deflector plates 646*a*, 746*b* turned off, no ion components reach the detector aperture 120. When the pusher deflector plate 646*a* voltage is swept with a positive voltage, ion components start to get pushed to the detector aperture 120. Heavier ions enter the detector aperture 120 first, while lighter ion components require higher voltages to sweep the ion components in order for the lighter ion components to reach the detector aperture 120.

Scanning a voltage on one or both of the deflector plates, such as by scanning a voltage on a pusher deflector plate 646*a*, and plotting the ion component signal (such as a partial pressure current) versus the voltage on the deflector plate, allows the generation of a real-time mass spectrum. For example, a graphic display can be created on a visual display device, showing detected partial pressure current in volts, provided by a pico-ammeter current to voltage converter, on the vertical axis, and time in seconds, which is linearly related to the voltage on the deflector plate (because the deflector voltage is swept with a sawtooth waveform), on the horizontal axis. In addition, automatic zero baseline subtraction can be performed.

In FIG. 9, a deflector power supply 972 is electrically connected to the ion beam deflector 646*a* to create the deflection electric field between the deflector plates 646*a*, 746*b* of the ion beam deflector. The deflector power supply 972 can be electrically connected to (i) provide a positive deflector bias voltage to a first deflector plate 646*a* of the ion beam deflector relative to a ground voltage of a second deflector plate 746*b* of the ion beam deflector, or (ii) provide a negative deflector bias voltage to the first deflector plate 646*a* relative to the ground voltage of the second deflector plate 746*b*, or (iii) provide a first deflector bias voltage to the first deflector plate 646*a* and a second deflector bias voltage 746*b* to the second deflector plate.

Figure 10:
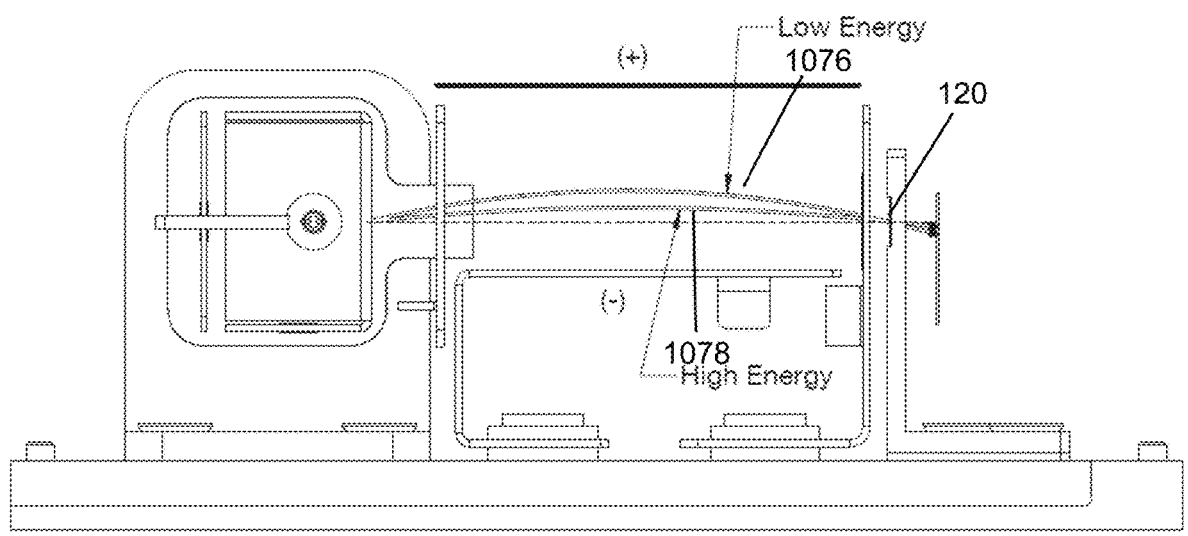
FIG. 10 is a schematic diagram showing energy focusing using deflector plates, in accordance with an embodiment of the invention.

In FIG. 9, a deflector control circuit 974 can be configured to supply a deflector control signal to the deflector power supply 972. The control circuit 974 can be configured to control a voltage of the deflector power supply 972 to cause the ion beam deflector 118 to direct displaced ion components having different energies and a common ion component mass to be focused through a detector aperture of the detector, as shown in FIG. 10, below. In addition, the deflector control circuit 974 can be configured to vary a voltage of the deflector power supply 972 to cause the ion beam deflector to vary a deflection of a displaced ion component of the emitted portion of the ions. The voltage of the deflector power supply 972 can be varied based on (i) a triangular sawtooth variation of the voltage with time (as shown in FIG. 8), or (ii) a voltage waveform to control a peak width and temporal position, relative to other ion components, of the displaced ion component. The deflector control circuit 974 can be configured to scan a voltage of the deflector power supply 972 to cause the ion beam deflector to deflect plural ion components 968*b-d* to be detected by the detector in succession as the voltage of the deflector power supply 972 is scanned; and can be configured to scan the voltage of the deflector power supply 972 to permit detection of a mass spectrum of the plural ion components, as described above.

In another version of the embodiment of FIG. 9, the ion beam deflector 118 can be configured to align an ion beam 758 (see FIG. 7) of the emitted portion of the ions on the detector. Current beam alignments, such as in helium sensors, rely on mechanical tuning of the electron beam at the hot cathode ionization source, which can be a slow and tedious process. However, by using an ion beam deflector 118 as described herein to realign an ion beam, no mechanical adjustment is required.

In addition, the ion beam deflector 118 can be used to determine spectral baseline offsets, by measuring at the top and the side of spectral peaks. This can also provide an advantage over conventional helium leak detectors.

FIG. 10 is a schematic diagram showing energy focusing using deflector plates, in accordance with an embodiment of the invention. In energy focusing, ion components having different energies and a common ion component mass are focused through a detector aperture 120 of the detector. For example, low energy ions 1076 and high energy ions 1078 of a common ion component, such as low energy water ions and high energy water ions, can be focused through the detector aperture 120. In another example, low energy residual gas ions and high energy residual gas ions can be focused through the detector aperture 120. In order to perform such energy focusing, a deflector control circuit 974 (of FIG. 9) is configured to control the voltage of the deflector power supply 972 (of FIG. 9) to cause the ion beam deflector to direct the ion components 1076 and 1078 having different energies and a common ion component mass to be focused through the detector aperture 120. For each ion component mass, there is a specific voltage of the deflector power supply that provides energy focusing. The ion beam for the mass of interest is oriented such that the deflector voltage at which the ion beam reaches the detector is also the same voltage at which energy focusing is achieved for that mass of interest. In a hot or cold cathode ionization source embodiment, this can be performed by displacing the detector aperture or source aperture (or both) sideways. In addition, in a cold cathode ionization source embodiment, the source can be rotated.

Figure 12:
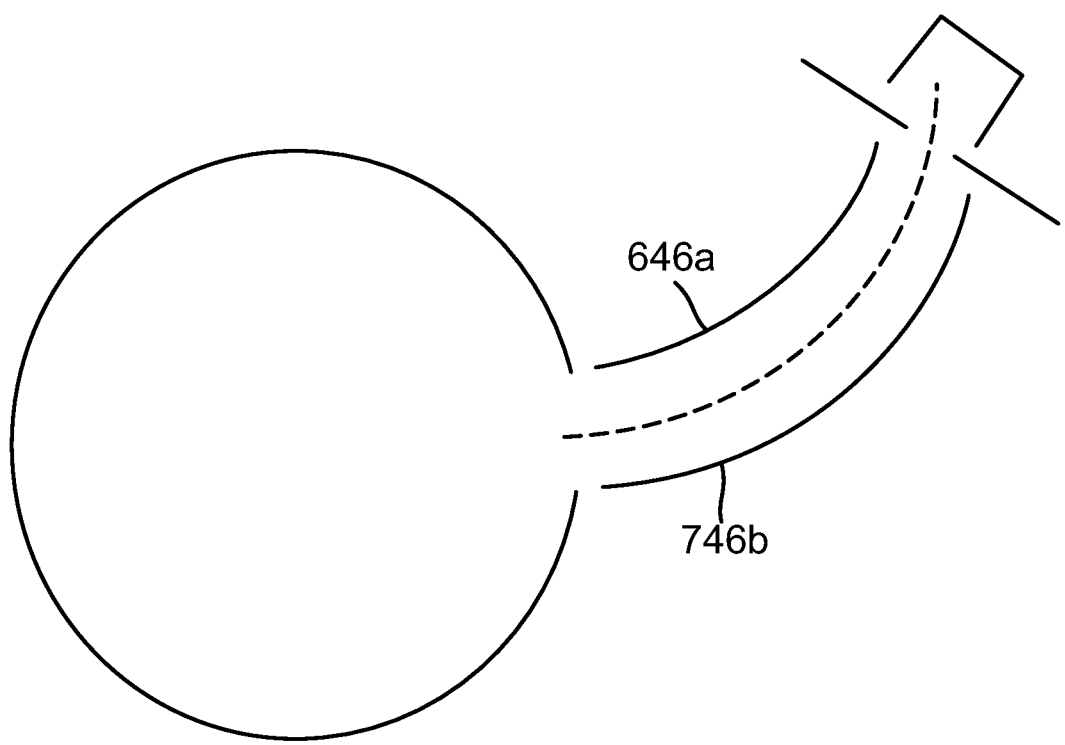
FIG. 12 is a schematic diagram of an ion beam deflector comprising a pair of curved plates, in accordance with an embodiment of the invention.

FIG. 12 is a schematic diagram of an ion beam deflector comprising a pair of curved plates, in accordance with an embodiment of the invention. Here, plates 646a and 746b are curved, unlike the parallel plates 646a and 746b shown elsewhere herein. Operation can be generally similar to that of the parallel plates described herein. It will be appreciated that a variety of different shapes and arrangements can be used for the ion beam deflector and plates 646a and 746b, and that the length and curvature of the curved plates 646a and 746b can be optimized.

Figure 11:
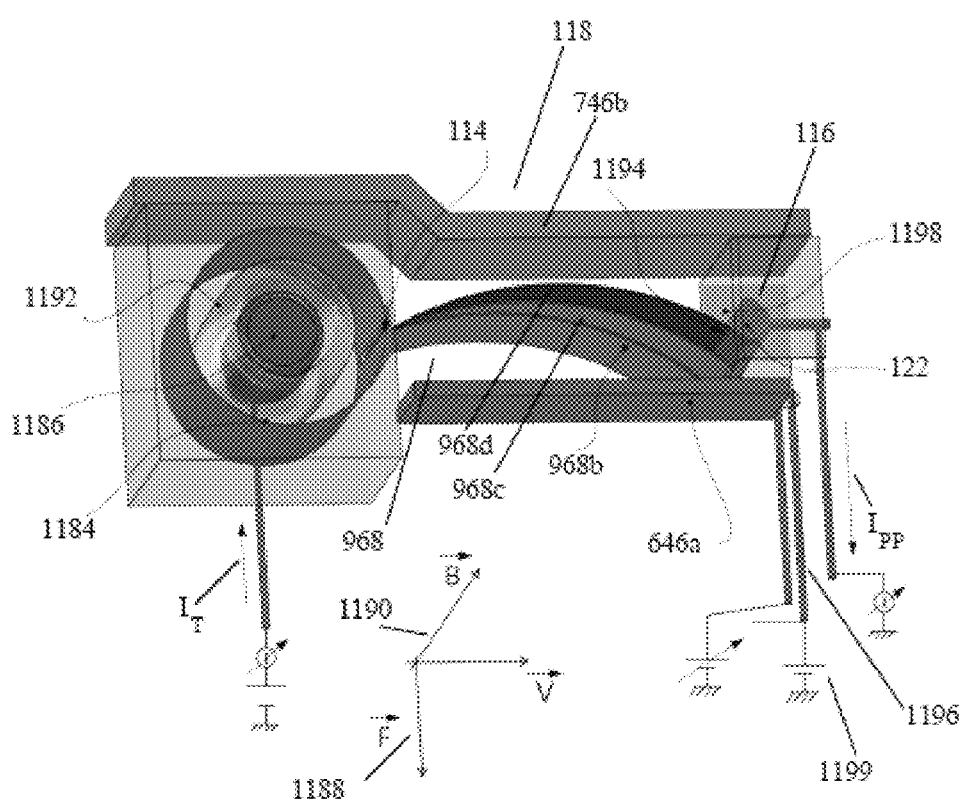
FIG. 11 is a schematic perspective view of a gas analyzer system that uses an inverted magnetron cold cathode discharge electrode configuration and an ion beam deflector to deflect ion components to be detected by the detector, in accordance with an embodiment of the invention.

In another embodiment, the ionization source can comprise a cold cathode ionization source. FIG. 11 is a schematic perspective view of a gas analyzer that uses an inverted magnetron cold cathode discharge electrode configuration and an ion beam deflector 118 to deflect ion components to be detected by the detector, in accordance with an embodiment of the invention. The ion beam deflector 118, such as a pair of parallel plates 646a and 746b, or a pair of curved plates (similar to those shown in FIG. 12), is positioned between the source aperture 114 and the detector 116. As with the hot cathode ionization source embodiment, the ion beam deflector 118 can be used to deflect ion components, and to perform energy focusing.

As with the hot cathode ionization source embodiment, displaced ion components 968 are separated into different ion components, which diverge increasingly from each other as they travel further from the source aperture 114. In the inverted magnetron cold cathode discharge electrode configuration, the cathode electrode assembly 1184 surrounds the anode electrode 1186. An axial magnetic field (created using a magnet assembly 264, not shown in FIG. 11) is centered on the anode electrode 1186, and a radial electric field is established by applying a high voltage potential, $V_{anode}$, to the anode electrode 1186. With the cross-field arrangement of the electric field and magnetic field (indicated by direction 1188 of the electric field and 1190 of the magnetic field), a pure electron plasma 1192 is established surrounding the anode electrode 1186. Gas molecules entering the pure electron plasma 1192 are ionized by the precessing electrons and form ions that are immediately accelerated towards the cathode electrode assembly 1184 by the radial electric field. The magnetic field inside the source is high enough (for example, 1 kGauss) to make electrons precess in tight circular trajectories, but has less influence on the heavier ions, producing a slight mass dependent magnetic deflection of their trajectories as they fly towards the cathode electrode assembly 1184. The source aperture 114, such as a vertical slit located on the cathode wall, allows a thin sliver of ion components 968 to exit the source. Using additional magnets (see 264 in FIG. 2, not shown in FIG. 11), the magnetic field is extended to the flight region between the source aperture 114 and the detector 116, thereby increasing mass dependent deflection of the ions into separate ion components 968b-d. Lighter ions are deflected more than heavier ions. For example, a displaced ion component 968b is made of helium ions, 968c is made of water ions, and 968d is made of residual gases, such as nitrogen and oxygen. Such increased deflection of the ion components using additional magnets can, for example, allow the separation of water ions from the rest of the residual gas ions 968d. The detector 116 includes a metallic Faraday collector half cylinder 122 that produces an ion current proportional to the ion flux reaching the detector 116 through the detector aperture 1194. This ion current is the partial pressure current, $I_{PP}$, of the ion component 968d that reaches the detector. Also shown in FIG. 11 is the total pressure current, $I_T$.

In addition, in the embodiment of FIG. 11, the ion beam deflector 118 is used to steer the ion components 968b-d into the detector aperture 1194. Also, a detector shield electrical connector 1196 is in electrical connection between a detector shield 1198 and a voltage source 1199 applying a detector shield bias voltage to the detector shield 1198, so that the detector shield 1198 thereby is a high pass ion energy filter. Using the high pass ion energy filter, only ions with energies above the detector shield bias voltage can cross the plane of the detector aperture 1194, and the rest get turned around. Increasing the detector shield bias voltage narrows the energy distribution or spread of ions that can reach the detector 116 during a deflector voltage sweep, resulting in narrower mass peaks as the voltage increases. Although the embodiment of FIG. 1 uses energy filter grids 124a/124b, other kinds of energy filter can be used. For example, in the embodiment of FIG. 11, the detector shield 1198 has a detector shield bias voltage applied to it (with the detector shield isolated from ground), so that the detector shield 1198 is a high pass ion energy filter. In the cold cathode ionization source embodiment of FIG. 11, the energy of the ions is dependent on the pressure of the gas: generally, the energy of the ions drops and the energy spread of the ions decreases as the pressure increases over the useful pressure range of the analyzer, which can, for example, be from $10^{-10}$ to $10^{-3}$ Torr. By contrast, with the hot cathode ionization source taught herein, the energy spread of the ions is small, and the energy of the ions does not change with pressure.

As used herein, a hot cathode ionization source can include any hot cathode ionization source, including those based on incandescent filaments and those using thermionic emission. In addition, other ionization sources can be used, including cold cathode ionization emitters, such as Electron Generator Arrays and Field Emitters. Hot cathode ionization sources are generally more complex than cold cathode ionization sources. However, hot cathode ionization sources provide ions with smaller energy distributions, which can lead to improved resolving power.

Systems taught herein can be used in a variety of different possible contexts, including, for example, as helium sensors in helium leak detectors; in mass spectrometers; in magnetic sectors; and for multi-gas detection.

A variety of different possible advantages can be achieved using embodiments taught herein. Ions can be generated with a narrower energy distribution, which translates into sharper peaks in the mass spectrum. This provides high resolution. In addition, the energy of the ions can be independent of pressure. The ion signal is linearly related to pressure, making quantification easier, since no complicated non-linear look-up tables are required. There is no change in ion energy with pressure, meaning that the peak locations and filter voltage do not need to be adjusted versus pressure, or the adjustments are smaller. A smaller size helium sensor can be provided for a helium leak detector, which provides an opportunity to reduce the size of current mass spectrometers. Compared to standard helium sensors in helium leak detectors, the ability to scan eliminates the need to use 180-degree bends, making the detectors much more compact. In addition, there is no need to adjust filament location, as is commonly done during the tuning of helium leak detectors. Instead, with the help of deflection plates, any changes in the location of the ion beams can be compensated with adjustments to the deflection plate voltage.

Further, the high energy source taught herein can be very efficient, in that the components of the system work well together. The same anode potential that energizes the ions, also attracts the electrons to the ionization region. The fact that the flight path is at ground reduces the chances for arcing or electrical shock. The voltages required are fairly small and easy to implement in electronics. With low potentials to start with, there can be ensured a small range energy distribution for the ions, resulting in well resolved spectra.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A gas analyzer system, the system comprising:
an ionization source configured to create a source electric field in an ionization region of the ionization source, the ionization region receiving a gas from a monitored chamber such that ions of the gas are formed in the ionization source;
a source aperture positioned to emit a portion of the ions of the gas out of the ionization source, the ions being accelerated by the source electric field in a direction towards the source aperture;
a magnet assembly positioned to define a magnetic field to angularly displace the emitted portion of the ions based on a mass to charge ratio of ions of the gas;
an ion beam deflector positioned between the source aperture and the detector, the ion beam deflector defining a deflection electric field across the magnetic field and across a direction of travel of the emitted portion of the ions;
a detector positioned to detect a displaced ion component of the emitted portion of the ions; and
ion current measurement circuitry electrically connected to measure a current produced from receipt of the displaced ion component at the detector.

2. The gas analyzer system of claim 1, wherein the ionization source comprises a cold cathode ionization source.

3. The gas analyzer system of claim 1, wherein the ionization source comprises a hot cathode ionization source.

4. The gas analyzer system of claim 3, wherein the hot cathode ionization source comprises a hot filament and an electron collector configured to create an electron beam through the ionization source between the hot filament and the electron collector.

5. The gas analyzer system of claim 4, wherein the hot filament and the electron collector are configured to create the electron beam in a direction parallel to the source aperture, the source aperture comprising an aperture elongated in the direction parallel to the electron beam.

6. The gas analyzer system of claim 1, further comprising an energy filter.

7. The gas analyzer system of claim 6, wherein the source aperture comprises an elongated aperture, and wherein the energy filter comprises an energy filter grid positioned in an ion beam path of the emitted portion of the ions, the energy filter grid comprising conductive filaments oriented substantially perpendicular to the elongated aperture of the source aperture, and comprising substantially no conductive filaments oriented substantially parallel to the elongated aperture of the source aperture.

8. The gas analyzer system of claim 6, wherein the energy filter comprises an entry grid positioned between the source aperture and an entry of an ion beam of the emitted portion of the ions into the ion beam deflector.

9. The gas analyzer system of claim 6, wherein the energy filter comprises an exit grid positioned between an exit of an ion beam of the emitted portion of the ions out of the ion beam deflector, and the detector aperture.

10. The gas analyzer system of claim 1, wherein the ion beam deflector is configured to align an ion beam of the emitted portion of the ions on the detector.

11. The gas analyzer system of claim 1, wherein the ion beam deflector comprises a pair of parallel plates.

12. The gas analyzer system of claim 1, wherein the ion beam deflector comprises a pair of curved plates.

13. The gas analyzer system of claim 1, wherein the source aperture is positioned to emit a portion of the ions of the gas out of the ionization source to enter the ion beam deflector closer to one side of the ion beam deflector than a geometrical center of the ion beam deflector.

14. The gas analyzer system of claim 1, further comprising a deflector power supply electrically connected to the ion beam deflector to create the deflection electric field between a pair of deflector plates of the ion beam deflector.

15. The gas analyzer system of claim 14, wherein the deflector power supply is electrically connected to (i) provide a positive deflector bias voltage to a first deflector plate of the ion beam deflector relative to a ground voltage of a second deflector plate of the ion beam deflector, or (ii) provide a negative deflector bias voltage to the first deflector plate relative to the ground voltage of the second deflector plate, or (iii) provide a first deflector bias voltage to the first deflector plate and a second deflector bias voltage to the second deflector plate.

16. The gas analyzer system of claim 14 or 15, further comprising a deflector control circuit configured to supply a deflector control signal to the deflector power supply.

17. The gas analyzer system of claim 16, wherein the deflector control circuit is configured to control a voltage of the deflector power supply to cause the ion beam deflector to direct displaced ion components having different energies and a common ion component mass to be focused through a detector aperture of the detector.

18. The gas analyzer system of claim 16, wherein the deflector control circuit is configured to vary a voltage of the deflector power supply to cause the ion beam deflector to vary a deflection of the displaced ion component of the emitted portion of the ions.

19. The gas analyzer system of claim 18, wherein the deflector control circuit is configured to vary the voltage of the deflector power supply based on (i) a triangular sawtooth variation of the voltage with time, or (ii) a voltage waveform to control a peak width and temporal position, relative to other ion components, of the displaced ion component.

20. The gas analyzer system of claim 16, wherein the deflector control circuit is configured to scan a voltage of the deflector power supply to cause the ion beam deflector to deflect plural ion components to be detected by the detector in succession as the voltage of the deflector power supply is scanned.

21. The gas analyzer system of claim 20, wherein the deflector control circuit is configured to scan the voltage of the deflector power supply to permit detection of a mass spectrum of the plural ion components.

22. The gas analyzer of claim 1, further comprising total current measurement circuitry electrically connected to measure a total ion current of the ionization source.

* * * * *

UNITED STATES PATENT AND TRADEMARK OFFICE
CERTIFICATE OF CORRECTION

| | | |
|---|---|---|
| PATENT NO. | : 10,948,456 B1 | Page 1 of 1 |
| APPLICATION NO. | : 16/698178 | |
| DATED | : March 16, 2021 | |
| INVENTOR(S) | : Gerardo A. Brucker, Timothy C. Swinney and Clinton L. Percy | |

It is certified that error appears in the above-identified patent and that said Letters Patent is hereby corrected as shown below:

In the Claims

In Claim 16, Column 14, Line 61, delete "claim 14 or 15" and insert -- claim 14 --.

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*